United States Patent [19]

Muris et al.

[11] Patent Number: 5,781,559
[45] Date of Patent: Jul. 14, 1998

[54] TESTABLE CIRCUIT

[75] Inventors: Mathias N. M. Muris; Franciscus G. M. De Jong; Johannes De Wilde; Rodger F. Schuttert, all of Eindhoven, Netherlands

[73] Assignee: U.S. Philips Corporation, New York, N.Y.

[21] Appl. No.: 734,009

[22] Filed: Oct. 18, 1996

[30] Foreign Application Priority Data

Oct. 20, 1995 [EP]  European Pat. Off. ............ 95202835

[51] Int. Cl.$^6$ .................................................. G01R 31/28
[52] U.S. Cl. ................................ 371/22.31; 371/22.34
[58] Field of Search ..................... 371/22.3, 22.4, 371/25.1, 22.31, 22.32, 22.34, 22.36, 22.5, 27.1, 28; 395/183.06, 183.03; 364/481, 550, 483, 489, 579; 324/765, 76.29, 76.11

[56] References Cited

U.S. PATENT DOCUMENTS

| | | | |
|---|---|---|---|
| 5,404,358 | 4/1995 | Russell | 371/22.3 |
| 5,565,801 | 10/1996 | Ernst | 327/74 |
| 5,581,176 | 12/1996 | Lee | 324/158.1 |
| 5,610,530 | 3/1997 | Whetsel | 324/763 |
| 5,610,826 | 3/1997 | Whetsel | 371/22.3 |

FOREIGN PATENT DOCUMENTS

0471399A1  2/1992  European Pat. Off.

*Primary Examiner*—Robert W. Beausoliel, Jr.
*Assistant Examiner*—Nadeem Iqbal
*Attorney, Agent, or Firm*—Brian J. Wieghaus

[57] ABSTRACT

A testable circuit comprises a signal path having a time-dependent response behavior (for example, a high-pass filter behavior). The signal path is tested for faults. To this end, the circuit is switched to a test mode in which the signal path is isolated from other signal paths. Subsequently, a test signal containing a signal transition is applied to the input of the signal path and it is tested whether the signal on the output of the signal path at any instant exceeds a threshold level during a predetermined time interval after the transition. The result is loaded into a register and read from the circuit.

15 Claims, 4 Drawing Sheets

TESTABLE CIRCUIT

BACKGROUND OF THE INVENTION

The invention relates to a testable circuit which can be switched between a normal operating mode and a test mode and comprises
a first and a second signal path,
connection means which are arranged to couple the first signal path functionally to an input of the second signal path in the normal operating mode and to decouple the first signal path functionally from the input of the second signal path in the test mode;
a detector for converting an analog signal on a test point into a digital signal;
a register which is arranged to store the digital signal in the test mode and can be read via an output of the circuit.

The invention also relates to an integrated circuit for use in such a circuit and to a method utilizing such a circuit.

A circuit of the kind set forth is known from German Patent No. 4400194 C1. The known circuit utilizes the standardized boundary scan test. The boundary scan test involves standardized test connections for digital integrated circuits and a standardized procedure for the application of test signals and the reading of test results. The major advantage of the standardized boundary scan test resides in the fact that it enables simple assembly of testable digital circuits utilizing existing components supplied by third parties.

The cited German Patent No. 4400194 C1 mentions that it is desirable to test also analog voltages and to read these voltages by means of the standardized boundary scan test procedure. The cited Patent, therefore, describes the use of a Schmitt trigger which derives a digital signal from the analog voltage in the circuit, which digital signal is treated in the same way as all other digital signals during the further test procedure.

According to the boundary scan test procedure, the various signal paths are logically separated from one another. Subsequently, a logic signal can be applied to one end of a signal path and be detected at its other end. This enables detection of faults such as an interruption of the signal path or a short-circuit to another signal path.

A signal path traversed by an analog signal may also include components which have a time-dependent, analog effect on the analog signal. An example in this respect is an RC high-pass filter as shown in FIG. 1. Between the input and the output the signal path comprises a capacitor C and a resistor R is connected between the output and ground. The normal response to a step signal on the input of this signal path is that the output signal first follows the input and subsequently drops to ground potential.

A number of feasible faults in such a signal path with a time-dependent response can be established on the basis of deviations from the normal analog time dependency of the signal on the output of the signal path.

In the example involving the RC high-pass filter of FIG. 1, short-circuiting of the capacitor prevents the signal from dropping to ground potential. This fault can be detected by checking whether the potential has returned to ground potential in the course of time. However, this could also be caused by short-circuiting of the resistor R. The latter can be tested by quickly testing the output signal after a step in the input signal. Faults in the signal path can thus be detected on the basis of the temporal behavior of the response.

The standard boundary scan test does not provide for the analysis of deviations of the normal analog time dependency of the response to a test signal. The cited German Patent No. 4400194 C1 fails to disclose how this is possible either.

European Patent No. 471399 describes an apparatus comprising facilities for testing supply leads for the absence of interference pulses during a boundary scan procedure. To this end, such an apparatus comprises a peak detector whose output is coupled to the shift register.

SUMMARY OF THE INVENTION

It is inter alia an object of the invention to provide a testable circuit in which the testing of fast time-dependent behavior of a signal path is possible, said testing utilizing input and output connections and a test procedure standardized for digital signals.

To this end, the testable circuit in accordance with the invention is characterized in that it comprises
signal-generating means which are operative in the test mode in order to generate a test signal on an input of the second signal path, a temporal variation of the test signal then containing a level transition;
the test point being coupled to an output of the second signal path and the second signal path having a time-dependent response behavior, and
the detector being arranged to detect whether a signal level on the test point has exceeded a threshold level at any instant during a predetermined time interval after the level transition, and to signal this occurrence by way of the digital signal.

The detector is thus capable of detecting a level transition on the output of the signal path which quickly follows the level transition on the input of the signal path. The speed at which the result is taken up in the register is irrelevant in this respect. In the boundary scan test this can take place, for example only after 2.5 clock cycles. The use of a detector which detects the presence of transitions in an interval renders this speed limitation irrelevant. The detector does not have a function in the normal operating mode. Therefore, it cannot form functionally part of the concatenation of signal paths wherethrough signals flow in the normal operating mode.

In an embodiment of the testable circuit in accordance with the invention the detector is arranged to switch over from a reset state to a set state when the signal level on the test point exceeds the threshold level, the detector comprising a reset input and means being coupled to the reset input in order to switch the detector to the reset state in synchronism with the generating of the level transition. The exceeding of the threshold level for resetting thus cannot affect the digital signal. The reset is executed preferably as briefly as possible before or simultaneously with the generating of the transition. In the absence of potentially disturbing effects, which could produce undesirable transitions on the test point, however, the reset can also be executed upon entering of the test mode, independently of the transition.

An embodiment of the testable circuit in accordance with the invention comprises a further detector which is coupled between the test point and the register and which is arranged to form a further digital signal which indicates whether said signal level is situated to a predetermined side of a further threshold level at a test instant, and to apply the further detection result to the register for storage. The circuit thus provides detection of the level of the signal on the test point during the time interval as well as at individual instants. The digital signal and the further digital signal can then be read together from the register, for example for testing the time-dependent response at a plurality of instants.

An embodiment of the testable circuit in accordance with the invention comprises a multiplexer, the detector and the further detector being coupled to respective inputs of the multiplexer and an output of the multiplexer being coupled to the register, and also comprises means for controlling which one of the digital signal and the further digital signal is stored in the register via the multiplexer. Thus, only a part (for example, only one) of the digital signals is stored in the register. This is advantageous, for example if the parameters of the signal path, notably the speed of response, are not yet known when integrated circuits forming part of the testable circuit are designed. In dependence on the parameters, a measurement in a time interval (the digital signal) or an instantaneous measurement (the further digital signal) can then be chosen for the test, without it being necessary to store additional information in the register.

In an embodiment of the testable circuit in accordance with the invention the register is formed by a shift register and the digital signal can be read by way of a shift transport. The shift register, which itself is standardized in the boundary scan test, thus serves to read the result of the observation of an analog signal in a time interval. The shift register can also be used to control the test signal. However, the invention can also be carried out without a shift register if the register can be read, for example via a bus interface such as the I2C bus.

An embodiment of a testable circuit in accordance with the invention comprises a support, an integrated circuit mounted on the support, and an analog filter circuit which is mounted on the support, forms part of the second signal path, is external of the integrated circuit and is coupled to a connection of the integrated circuit, the test point being coupled to the connection and the integrated circuit comprising the test point, the detector and the register. The invention is attractive notably for the testing of signal paths outside integrated circuits when these signal paths have a time-dependent response behavior. The testing of internal signal paths in an integrated circuit is simpler, because the designer of the integrated circuit can independently take the necessary steps without having to take into account the environment of the integrated circuit. Because the invention does not necessitate modification of the standardized boundary scan test procedure, it is notably suitable for the testing of external signal paths (from another integrated circuit but also from the integrated circuit itself).

The invention also relates to a method of testing the described circuits.

These and other aspects of the invention will be apparent from and elucidated with reference to the embodiments described hereinafter.

DESCRIPTION OF THE PREFERRED EMBODIMENT

Figure 1:
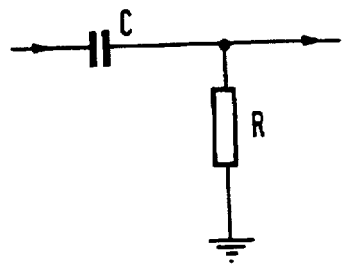
FIG. 1 shows a known high-pass RC filter.
Figure 2:
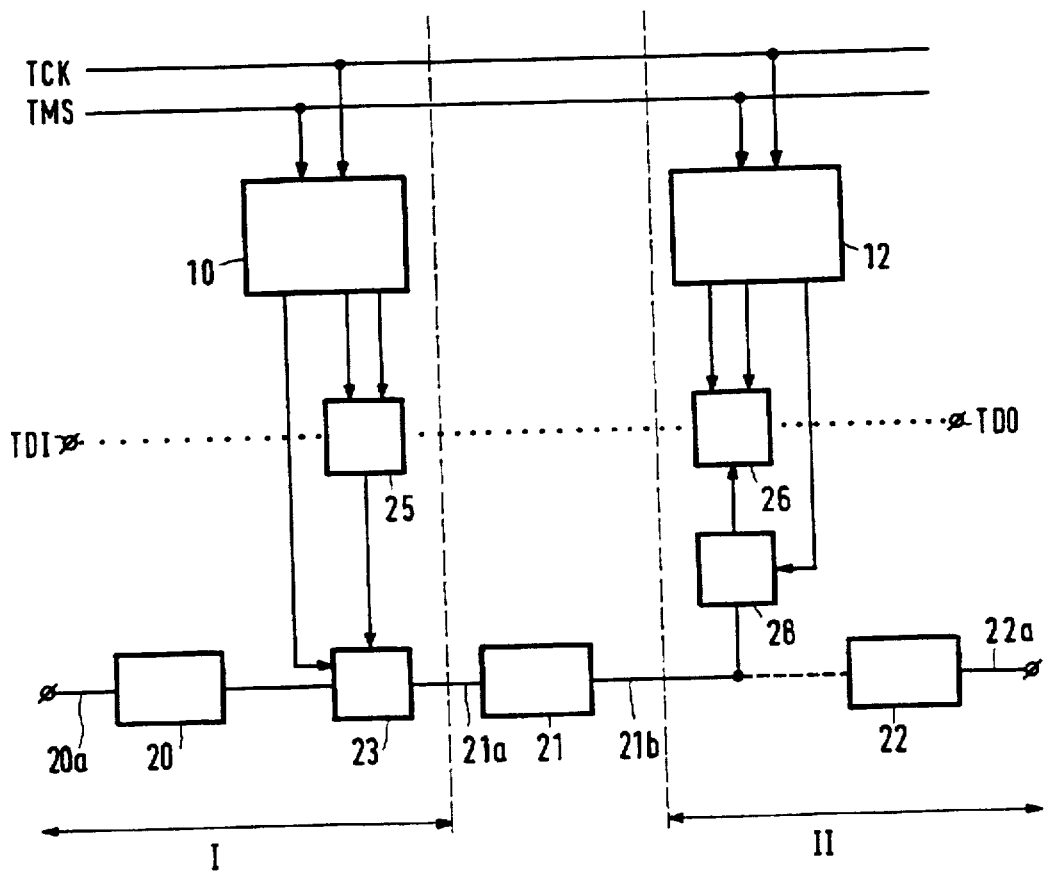
FIG. 2 shows a testable circuit in accordance with the invention.

FIG. 2 shows a testable circuit in accordance with the invention. The circuit comprises a series of signal paths 20, 21, 22 which are coupled between a circuit input 20a and a circuit output 22a. The second signal path comprises, for example a high-pass filter as shown in FIG. 1. The circuit furthermore comprises a shift register 25, 26 which has an input TDI and an output TDO. A first and a second storage element 25, 26 of the shift register 25, 26 are explicitly shown. The presence of further storage elements is symbolized by a dotted representation of the connections between the input TDI, the first storage element 25, the second storage element 26 and the output TDO. The circuit comprises a clock connection TCK and a control connection TMS which is coupled to all storage elements of the shift register 25, 26.

In the series of signal paths 20, 21, 22 a switching unit 23 is connected between a first and a second signal path 20, 21. A signal input of the switching unit 23 is coupled to an output of the first storage element 25. An output of the second signal path 21, being coupled to the remainder of the series of signal paths, is tapped and coupled to a detector 28. An output of the detector 28 is coupled to the second storage element 26.

The circuit furthermore comprises a first and a second test control circuit 10, 12. These circuits comprise control inputs which are coupled to a clock connection TCK and a control connection TMS. The first test control circuit 10 is coupled to control inputs of the first storage element 25 and of the switching unit 23. The second test control circuit 12 is coupled to control inputs of the second storage element 26 and to a reset input of the detector 28.

The circuit shown in FIG. 2 comprises two sections I, II which are accommodated in two integrated circuits. The second signal path 21 extends between these two integrated circuits, but externally of both circuits. The integrated circuits and the signal path are mounted, for example on a support.

During operation in a normal operating mode of the circuit, signals are presented to the input 20a of the series of signal paths 20, 21, 22. The signal paths 20, 21, 22 are functionally connected in series, so that in response to the signals presented signals will appear on the output 22a.

The circuit enters a first phase of the test mode after a signal transition on the test control connection TMS. During the first phase the test control circuits drive the shift register 25, 26 in a clocked fashion. Thus, test signals received on the input TDI shift, via the storage elements 25, 26, test signals through the register 25, 26 in the direction of the output TDO. During the first phase the switching unit 23 keeps the signal on the input 21a of the second signal path 21 at an initial value.

After a second signal transition on the test control connection TMS, the circuit enters a second phase of the test mode. As from a clock signal on the clock connection TCK after the entering of the second phase, the first test control circuit 10 controls the switching unit 23 in such a manner that it applies a test signal from the first storage element 25 to the input 21a of the signal path 21. If this test signal deviates from the initial value, a signal level transition occurs on the input 21a of the signal path 21. Furthermore, when the second phase is reached the second test control circuit 12 applies a reset signal to the detector 28.

The level transition on the input of the second signal path 21 causes a response on the output of the signal path 21. This response is applied to the input of the detector 28. If the level of the response exceeds a predetermined threshold, the detector will be set. Thus, the result signal from the detector will be, for example logic LOW for as long as the threshold has not been exceeded since the reset; otherwise it will be logic HIGH.

After a third signal transition on the test control connection TMS, the circuit enters a third phase of the test mode. In response to a clock signal on the clock connection TCK after the entering of the third phase, the second test control circuit 12 controls the second storage element 26 of the shift register 25, 26 in such a manner that it stores the result signal from the detector. Subsequently, the test control circuits 10, 12 clock the storage elements 25, 26 in such a manner that the result signal is shifted to the output TDO of the shift register 25, 26 for inspection.

Even though FIG. 2 shows two integrated circuits, the invention can also be used in the case of a single integrated circuit, for example if the second signal path 21 extends externally between two pins of one and the same integrated circuit, or if it extends internally in the circuit. In that case the use of a single test control unit 10 comprising more outputs suffices.

Figure 3:
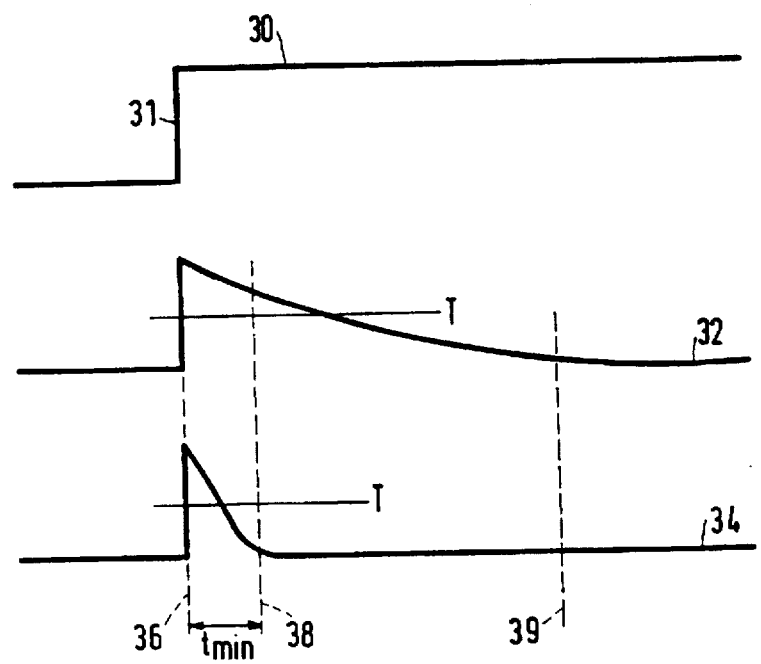
FIG. 3 shows the response behavior of a high-pass filter.

FIG. 3 shows the normal response behavior of an RC high-pass filter as shown in FIG. 1. A first trace 30 represents a signal on the input of the high-pass filter. This signal contains a transition 31. A second trace 32 shows a first response. A third trace 34 shows a second response which is faster than the first response. Together with the second trace 32 and the third trace 34, a threshold level T is shown.

If there are faults in the RC high-pass filter, the response will deviate from the normal response shown in FIG. 3. For example, if a connection between the capacitor C and the remainder of the filter is interrupted, the potential on the output will always be low. If the capacitor C is short-circuited, the potential on the output will be a copy of the signal on the input. If the resistor R is short-circuited, the potential on the output will always remain low. If a connection to the resistor R is interrupted, the filter will exhibit a high-pass behavior with a much longer RC time than normal.

These faults can be detected by checking whether 1) the potential on the output exceeds a threshold level T at a first instant which is situated less than the RC time of the filter after the transition 31 of the potential on the input,
2) the potential on the output is low at a second instant which is situated more than the RC time of the filter after the transition 31 of the potential on the input. If the normal response corresponds to the response of the second trace 32, these checks can be performed by comparing the response with a threshold value at two instants 38, 39.

If the response satisfies both conditions, none of the above faults has occurred. If only a part of said faults can occur, execution of even a part of the tests suffices (for example, the first test suffices if only faulty connections to the capacitor are possible).

The circuit shown in FIG. 2 generates the transition 31 in the signal on the input at a transition instant 36 of a first signal on the clock connection TCK during said second phase of the test. The circuit can store the response to the transition 31 in the shift register 25, 26 only after a given delay after said transition instant 36. In the standardized boundary scan test this delay amounts to 2.5 times the period of the signal on the clock connection TCK. The delay is denoted by the reference $t_{min}$ FIG. 3; the circuit can store the response in the shift register 25, 26 only as from an earliest instant 38.

This is problematic if the response of the filter is faster than this delay, for example if the normal response corresponds to the third trace 34. In this case the above test 1) cannot be carried out by comparing the potential at or after the earliest instant 38 with the threshold.

This problem is solved by the detector 28. The detector 28 determines whether the potential level on the output has exceeded the threshold at any instant between the transition instant 36 and the detection instant (for example, the earliest instant 38). The detection result replaces said test 1). Therefore, on the basis of this detection result it can be established whether or not a fault is present in the connections to the capacitor C.

The RC high-pass filter serves merely as an example for the testing of a signal path 21. It will be evident that such a test can also be carried out on a variety of other signal paths having a time-dependent response, for example band-pass filters (SAW filters) or low-pass filters.

Generally speaking, it is determined for which faults the signal path must be tested and also at which instants these faults lead to a detectable deviation in the response of the signal path. At these instants the response is observed, the result is stored in the shift register 25, 26 and applied to the output TDO. If the normal response is too fast to be detected by thresholding and direct storage in the shift register, use is made of a detector 28 as shown in FIG. 2.

For the signal path a variety of input signals other than the step shown in the first trace 30 can be used, for example a pulse consisting of two mutually opposed transitions. To this end, for example a waveform generator (not shown) is inserted between the first storage element of the shift register 25 and the switching unit 23.

Figure 4:
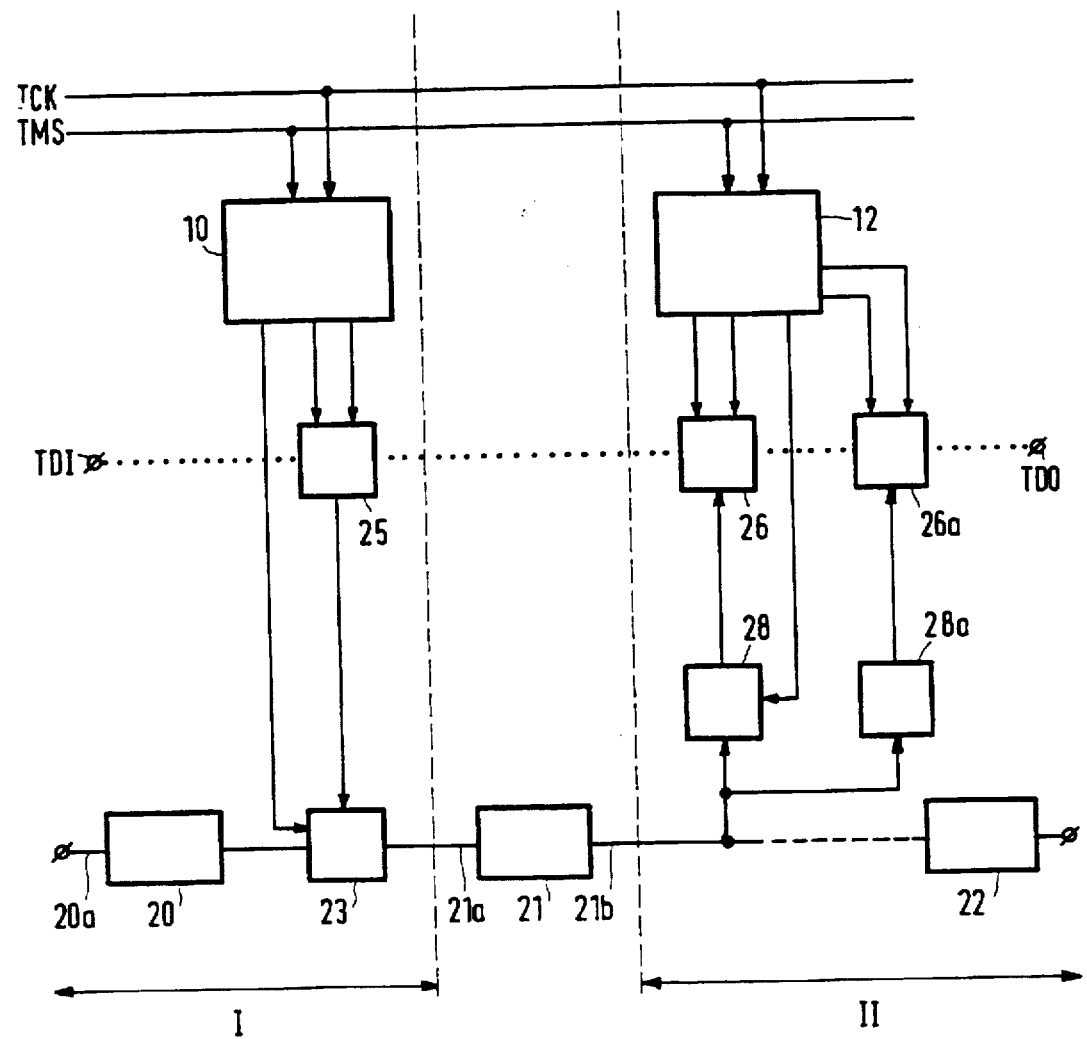
FIG. 4 shows a further testable circuit in accordance with the invention.

FIG. 4 shows a further testable circuit in accordance with the invention. Parts corresponding to FIG. 2 are denoted by corresponding references. The difference between the circuit of FIG. 4 and that of FIG. 2 consists in that it comprises a threshold circuit 28a and a further storage element 26a of the shift register 25, 26. The input of the detector 28 is coupled to an input of the threshold circuit 28a and an output of the threshold circuit 28a is coupled to an input of the further storage element 26a.

The circuit shown in FIG. 4 operates in the same way as that shown in FIG. 2, but additionally the second test control circuit 12 controls the further storage element 26a of the shift register 25, 26 in such a manner that it stores the result signal from the threshold circuit 28a in response to a clock signal on the clock connection TCK after the entering of the third phase. Subsequently, the result signals of the detector 28 and the threshold circuit 28a are shifted, clocked together by a signal on the clock connection TCK, to the output TDO of the shift register 25, 26 for inspection of the result signals.

The inspection can thus reveal whether at the instant of storage in the shift register 25, 26 the signal level on the output of the signal path 21 is situated to a predetermined side (for example, above) a threshold level of the threshold circuit 28a.

Simultaneously with the testing of the short-time behavior of the response by means of the detector (replacement of test 1) the circuit also enables the reading of the long-time behavior (test 2) via the shift register. If desired, even more detectors can be included in the circuit, their input being coupled to the output of the signal path 21. These detectors operate, for example with thresholds other than the detector 28 or with transitions in sub-intervals between the transition on the input of the signal path and the instant of storage in the shift register, or with threshold comparisons executed at a variety of instants. All such detectors can be coupled to respective storage elements of the shift register 25, 26, so that the detection results of these storage elements can be shifted to the output TDO of the shift register.

The further storage element 26a itself can also perform the function of the threshold circuit 28a. This is because the storage element 26a will be logic HIGH or LOW in dependence on whether the signal on its input is above or below a threshold. If desired, therefore, the separate threshold circuit 28a can be replaced by a direct connection.

Figure 5:
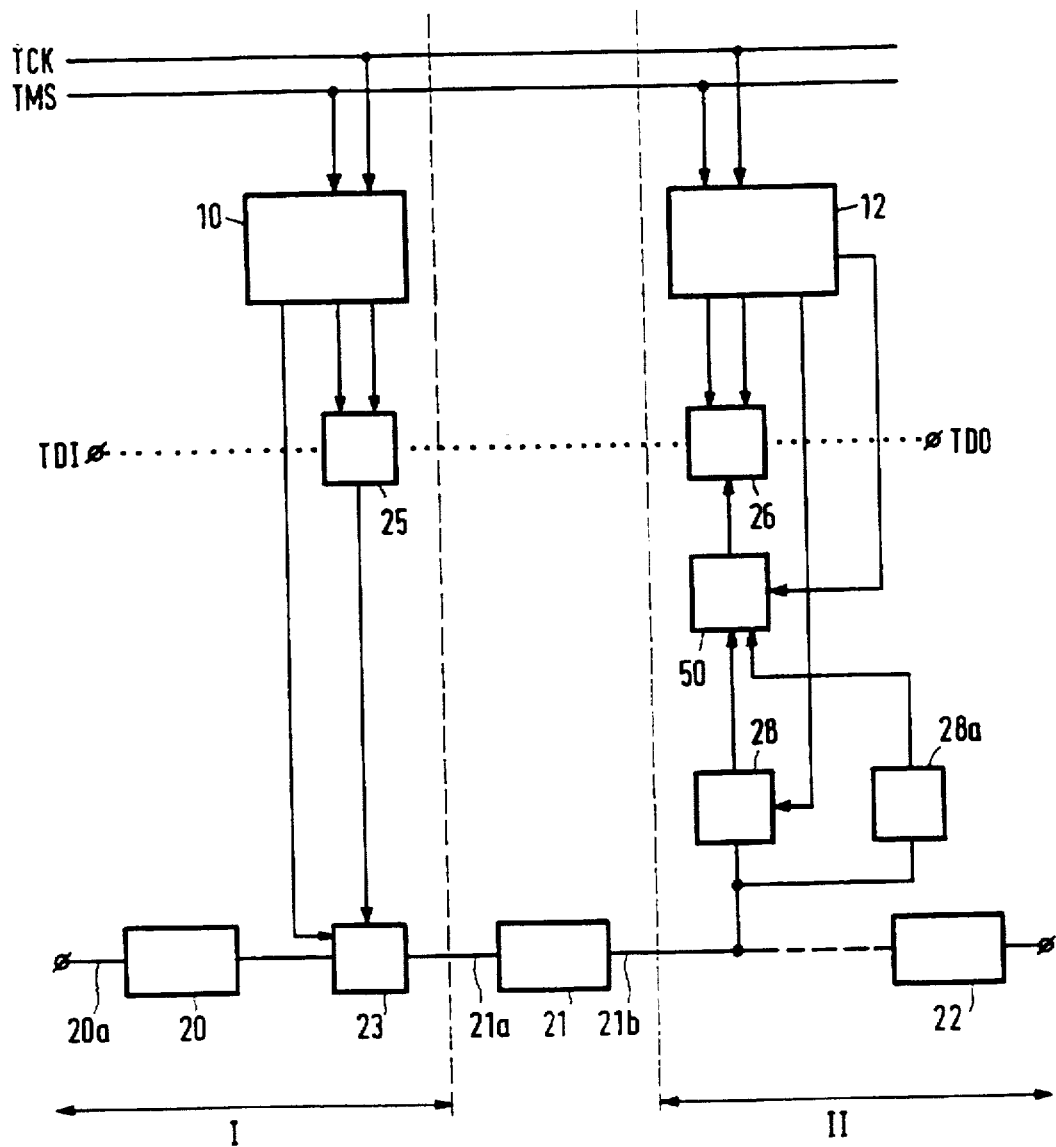
FIG. 5 shows a further testable circuit in accordance with the invention.

FIG. 5 shows a further testable circuit in accordance with the invention. Parts which correspond to FIG. 4 are denoted by corresponding references. The difference between the circuit shown in FIG. 5 and that shown in FIG. 4 consists in that the circuit shown in FIG. 5 comprises a multiplexer 50. The outputs of the detector 28 and the threshold circuit 28a are coupled to respective inputs of the multiplexer. The output of the multiplexer 50 is coupled to the input of the second storage element 26 of the shift register. The second control circuit 12 is coupled to a control input of the multiplexer 50.

During operation the second control circuit 12 determines which one of the inputs of the multiplexer 50 is connected to the input of the second storage element 26. Thus, only one of the detection results of the detector 28 and the threshold circuit 28a will ultimately be read via the output TDO of the shift register 25, 26. The second test control circuit 12 selects the relevant detection result, for example in dependence on a number of clock pulses on the clock connection TCK arriving between given signal transitions on the control connection TMS.

The multiplexer is advantageous notably if the detector 28, the threshold circuit, the multiplexer and at least the part of the shift register which comprises the second storage element 26 and the further storage element 26a, are accommodated together in an integrated circuit, the second signal path being external of said integrated circuit. The user of the integrated circuit will mount such an integrated circuit on a support (for example, a printed circuit board) together with the components of the signal path. In dependence on the components used, and notably on the expected differences in temporal behavior between the fault-free version of the signal path and possibly faulty versions of the signal path, the user can subsequently choose which detection result is to be read.

Figure 6:
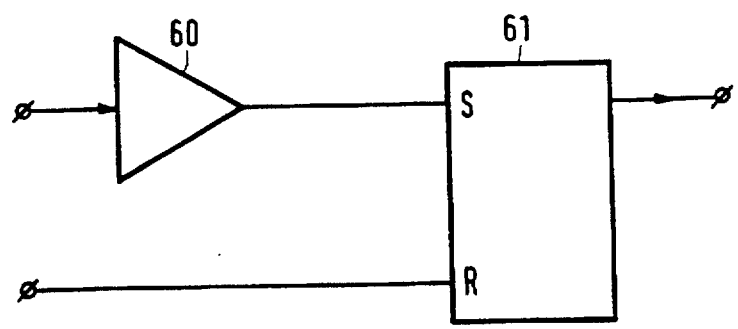
FIG. 6 shows a detector for use in a testable circuit in accordance with the invention.

FIG. 6 shows a detector for use in a circuit in accordance with the invention. This detector comprises a threshold circuit 60 and a flip-flop 61. An output of the threshold circuit 60 is coupled to an input of the flip-flop 61. An output of the flip-flop 61 constitutes an output of the detector.

During operation the flip-flop 61 is reset before or simultaneously with the generating of the transition on the input of the signal path. The input of the threshold circuit 60 constitutes the input of the detector. As soon as the potential on the input exceeds the threshold of the circuit 60, the flip-flop is set. The detector thus detects whether the signal has exceeded the threshold since the reset.

Many other detector embodiments are feasible. For example, a peak detector could be used to monitor the peak value of the signal on the input of the detector after the reset and to present this peak value, via a threshold circuit, to the input of a storage element of the shift register 25, 26 (i.e. without flip-flop). (A peak detector is, for example a diode connected between the input of the detector and the input of the threshold circuit, a capacitor being connected between the latter input and ground; upon reset this capacitor is discharged to ground).

We claim:

1. A testable circuit which can be switched between a normal operating mode and a test mode, said circuit comprising:

a first and a second signal path, connection means to couple the first signal path functionally to an input of the second signal path in the normal operating mode and to decouple the first signal path functionally from the input of the second signal path in the test mode;

a detector for converting an analog signal on a test point into a digital signal;

a register for storing the digital signal from the detector in the test mode, said register being readable via an output of the circuit;

signal-generating means operative in the test mode to generate a test signal, on an input of the second signal path, containing a level transition;

the test point being coupled to an output of the second signal path and the second signal path having a time-dependent response behavior, and the detector detecting whether a signal level on the test point has exceeded a threshold level at any instant during a predetermined time interval after the level transition, and signalling this occurrence by way of the digital signal.

2. A testable circuit as claimed in claim 1, wherein the detector switches over from a reset state to a set state when the signal level on the test point exceeds the threshold level, the detector comprising a reset input and means coupled to the reset input to switch the detector to the reset state in synchronism with the generating of the level transition by the signal generating means.

3. A testable circuit as claimed in claim 2, comprising a further detector, coupled between the test point and the register, (i) forming a further digital signal indicating whether said signal level is situated to a predetermined side of a further threshold level at a test instant, and (ii) applying the further detection result to the register for storage.

4. A testable circuit as claimed in claim 3, comprising a multiplexer, the detector and the further detector being coupled to respective inputs of the multiplexer and an output of the multiplexer being coupled to the register, and also comprising means for controlling which one of the digital signal and the further digital signal is stored in the register via the multiplexer.

5. A testable circuit as claimed in claim 4, wherein the first signal path comprises a high-pass filter connected between the input of the signal path and the test point.

6. A testable circuit as claimed in claim 5, wherein the register is a shift register and the digital signal can be read out by shift transportation.

7. A testable circuit as claimed in claim 6, comprising a support, an integrated circuit mounted on the support, and an analog filter circuit which is mounted on the support, the analog filter circuit forming part of the second signal path, being external to the integrated circuit and coupled to a connection of the integrated circuit, the test point being coupled to the connection and the integrated circuit comprising the test point, the detector and the register.

8. An integrated circuit for use in a circuit as claimed in claim 7.

9. A method of testing a circuit which comprises a signal path which forms part of a series of signal paths which are functionally connected in series in a normal operating mode of the circuit, which method comprises the following steps:

switching the circuit to a test mode in which the signal paths of the series of signal paths are functionally separated;

generating a test signal on an input of the signal path the test signal containing a level transition;

detecting whether in response to the level transition a signal level on a test point has exceeded a threshold level at any instant during a predetermined time interval after the level transition;

storing a detection result signal in a register.

reading the result signal from the register of the circuit.

10. A method as claimed in claim 9, which method comprises the further steps of further detecting whether the signal level on the test point is situated to a predetermined side of a further threshold level at a further instant after the level transition;

storing a further detection signal in the register.

reading the further detection signal, together with the result signal, from the register of the circuit.

11. A testable circuit as claimed in claim 1, comprising a further detector, coupled between the test point and the register, (i) forming a further digital signal indicating whether said signal level is situated to a predetermined side of a further threshold level at a test instant, and (ii) applying the further detection result to the register for storage.

12. A testable circuit as claimed in claim 11, comprising a multiplexer, the detector and the further detector being coupled to respective inputs of the multiplexer and an output of the multiplexer being coupled to the register, and also comprising means for controlling which one of the digital signal and the further digital signal is stored in the register via the multiplexer.

13. A testable circuit as claimed in claim 1, wherein the first signal path comprises a high-pass filter connected between the input of the signal path and the test point.

14. A testable circuit as claimed in claim 1, in which the register is a shift register and the digital signal can be read out by shift transportation.

15. A testable circuit as claimed in claim 1, comprising a support, an integrated circuit mounted on the support, and an analog filter circuit which is mounted on the support, the analog filter circuit forming part of the second signal path, being external to the integrated circuit and coupled to a connection of the integrated circuit, the test point being coupled to the connection and the integrated circuit comprising the test point, the detector and the register.

* * * * *